United States Patent
Fukasawa et al.

(10) Patent No.: US 9,001,490 B2
(45) Date of Patent: Apr. 7, 2015

(54) SUBSTRATE FIXING DEVICE AND METHOD FOR MANUFACTURING THE SAME

(71) Applicant: Samsung Display Co., Ltd., Yongin, Gyeonggi-Do (KR)

(72) Inventors: Takayuki Fukasawa, Seoul (KR); Ji-Hun Kim, Hwaseong-si (KR); Sang-Gab Kim, Seoul (KR); Hyun-Min Cho, Suwon-si (KR)

(73) Assignee: Samsung Display Co., Ltd. (KR)

( * ) Notice: Subject to any disclaimer, the term of this patent is extended or adjusted under 35 U.S.C. 154(b) by 161 days.

(21) Appl. No.: 13/745,954

(22) Filed: Jan. 21, 2013

(65) Prior Publication Data

US 2014/0063680 A1  Mar. 6, 2014

(30) Foreign Application Priority Data

Sep. 5, 2012 (KR) .......................... 10-2012-0098301

(51) Int. Cl.
| | | |
|---|---|---|
| H01T 23/00 | (2006.01) | |
| H02N 13/00 | (2006.01) | |
| B05D 1/38 | (2006.01) | |
| B05D 5/12 | (2006.01) | |
| C23C 16/00 | (2006.01) | |
| H01L 21/683 | (2006.01) | |
| H01L 21/687 | (2006.01) | |

(52) U.S. Cl.
CPC .................. *H02N 13/00* (2013.01); *B05D 1/38* (2013.01); *B05D 5/12* (2013.01); *C23C 16/00* (2013.01); *H01L 21/6831* (2013.01); *H01L 21/6875* (2013.01)

(58) Field of Classification Search
USPC ......................................................... 361/234
See application file for complete search history.

(56) References Cited

U.S. PATENT DOCUMENTS

| | | | | |
|---|---|---|---|---|
| 5,886,863 | A * | 3/1999 | Nagasaki et al. .............. | 361/234 |
| 6,606,234 | B1 | 8/2003 | Divakar | |
| 6,768,627 | B1 * | 7/2004 | Kitabayashi et al. ......... | 361/234 |
| 7,209,339 | B2 * | 4/2007 | Kitabayashi et al. ......... | 361/234 |
| 7,718,007 | B2 | 5/2010 | Oohashi et al. | |
| 2004/0085706 | A1 | 5/2004 | Tomoyoshi | |
| 2007/0217117 | A1 | 9/2007 | Ohta et al. | |

FOREIGN PATENT DOCUMENTS

| | | |
|---|---|---|
| JP | 3323298 B2 | 6/2002 |
| JP | 2006054289 A | 2/2006 |

* cited by examiner

*Primary Examiner* — Stephen W Jackson
(74) *Attorney, Agent, or Firm* — Cantor Colburn LLP

(57) ABSTRACT

In a substrate fixing device and a method form manufacturing the substrate fixing device, the substrate fixing device includes a lower electrode, a dielectric layer and a plurality of protrusions. The dielectric layer is disposed on the lower electrode. The protrusions are spaced apart from each other, and are protruded from the dielectric layer. Each of the protrusions includes an insulating layer disposed on the dielectric layer, and an upper layer disposed on the insulating layer and contacting a substrate.

26 Claims, 13 Drawing Sheets

SUBSTRATE FIXING DEVICE AND METHOD FOR MANUFACTURING THE SAME

This application claims priority to Korean Patent Application No. 10-2012-0098301, filed on Sep. 5, 2012, and all the benefits accruing therefrom under 35 U.S.C. §119, the contents of which in its entirety is herein incorporated by reference.

BACKGROUND

1. Field

Exemplary embodiments of the invention relate to a substrate fixing device and a method for manufacturing the substrate fixing device. More particularly, exemplary embodiments of the invention relate to a substrate fixing device used for a plasma processing device and a method for manufacturing the substrate fixing device.

2. Description of the Related Art

In plasma processing such as dry etching, chemical vapor deposition ("CVD"), sputtering and so on, a substrate fixing device fixes a substrate in a chamber of a plasma processing device.

As the substrate fixing device, a mechanical chuck is conventionally used. As an alternative to the mechanical chuck, an electrostatic chuck which fixes the substrate with an electrostatic force has been developed to maintain uniformity in the plasma processing of a large-sized substrate.

SUMMARY

One or more exemplary embodiment of the invention provides a substrate fixing device capable of uniformly distributing a temperature of a substrate.

One or more exemplary embodiment of the invention also provides a method for manufacturing the substrate fixing device.

In an exemplary embodiment of a substrate fixing device according to the invention, the substrate fixing device includes a lower electrode, a dielectric layer and a plurality of protrusions. The dielectric layer is disposed on the lower electrode. The protrusions are spaced apart from each other, and are protruded from the dielectric layer. Each protrusion includes an insulating layer disposed on the dielectric layer, and an upper layer disposed on the insulating layer and contacting a substrate.

In an exemplary embodiment, the upper layer may include at least one of aluminum oxide, silicon oxide, carbon compound, boron nitride, titanium (Ti) and molybdenum (Mo).

In an exemplary embodiment, the each protrusion may further include a first adhesive layer disposed between the dielectric layer and the insulating layer.

In an exemplary embodiment, the each protrusion may further include a second adhesive layer disposed between the insulating layer and the upper layer.

In an exemplary embodiment, the each protrusion may further include a supporting portion extending from the dielectric layer and through the insulating layer.

In an exemplary embodiment, the supporting portion may include substantially a same material as the dielectric layer.

In an exemplary embodiment, the each protrusion may further include a first adhesive layer disposed between the dielectric layer and the insulating layer, and a second adhesive layer disposed between the insulating layer and the upper layer.

In an exemplary embodiment, the lower electrode may include aluminum (Al). The dielectric layer may include aluminum oxide. The insulating layer may include at least one of porous organic or inorganic material, polytetrafluoroethylene ("PTFE"), polychlorotrifluoroethylene ("PCTFE"), polyvinylidene difluoride ("PVDF"), polyvinyl fluoride ("PVF"), epoxy resin, silicone resin, polyimide resin, polyetherimide ("PEI") and thermal-resisting rubber.

In an exemplary embodiment, the substrate fixing device may further include helium gas charged between adjacent protrusions.

In another exemplary embodiment of a substrate fixing device according to the invention, the substrate fixing device includes a lower electrode, a dielectric layer, a porous layer and a plurality of protrusions. The dielectric layer is disposed on the lower electrode. The porous layer is disposed on the dielectric layer. The plurality of protrusions is spaced apart from each other, and protrudes from the dielectric layer and through the porous layer. Each protrusion includes an insulating layer disposed on the dielectric layer.

In an exemplary embodiment, the porous layer may include ceramic or a carbon nanotube.

In an exemplary embodiment, each protrusion may further include an adhesive layer between the dielectric layer and the insulating layer.

In an exemplary embodiment of a method for manufacturing a substrate fixing device according to the invention, the method includes providing a dielectric layer on a lower electrode. A mask including an opening portion is provided on the dielectric layer. An insulating material is provided in the opening portion of the mask on the dielectric layer. The insulating material is dried to form a stepped portion between the mask and the insulating material. The hard material is provided on the mask and the insulating material.

The mask is removed to form a protrusion including an insulating layer including the insulating material and an upper layer including the hard material.

In an exemplary embodiment, the insulating material may be printed via a silk screen printing process or an inkjet printing process.

In an exemplary embodiment, the hard material may be provided via a sputtering process.

In an exemplary embodiment, the method may further include providing a first adhesive material on the mask and the dielectric layer, before the providing an insulating material.

In an exemplary embodiment, the method may further include providing a second adhesive material on the mask and the dielectric layer, before the providing a hard material.

In an exemplary embodiment, the method may further include providing a supporting portion on the dielectric layer, before the providing an insulating material on the dielectric layer. The providing the mask may dispose the supporting portion in the opening portion of the mask.

In an exemplary embodiment, the forming the stepped portion between the mask and the insulating material exposes the supporting portion.

In another exemplary embodiment of a method for manufacturing a substrate fixing device according to the invention, the method includes providing a dielectric layer on a lower electrode. An insulating material is provided on a predetermined position of the dielectric layer, to form an insulating layer of a plurality of protrusions spaced apart from each other. A hard material is provided on the insulating layer, to form an upper layer of the protrusions.

In an exemplary embodiment, the method may further include providing a first adhesive material on the predetermined position of the dielectric layer, to form a first adhesive layer of the protrusions, before the forming an insulating layer.

In an exemplary embodiment, the method may further include providing a second adhesive material on the insulating layer, to form a second adhesive layer of the protrusions, before the forming the upper layer.

In still another exemplary embodiment of a method for manufacturing a substrate fixing device according to the invention, the method includes providing a dielectric layer on a lower electrode. A porous layer is provided on the dielectric layer. A mask is provided on the porous layer on the dielectric layer, and the porous layer is partially removed using the mask. An insulating material is provided in an opening portion defined in the mask on the dielectric layer. The mask is removed to form a protrusion including an insulating layer comprising the insulating material.

In an exemplary embodiment, the providing a porous layer may include coating a suspension including a ceramic fine particle and a solvent on the dielectric layer, and sintering the suspension to form the porous layer.

In an exemplary embodiment, the providing the porous layer may include growing a carbon nanotube on the dielectric layer.

In an exemplary embodiment, the method may further include providing an adhesive material on the mask and the dielectric layer, before the providing an insulating material.

According to one or more exemplary embodiment of the invention, a protrusion of a substrate fixing device includes an upper layer contacting a substrate supported by the substrate fixing device. Since the upper layer includes a hard material, wear of the upper layer may be decreased from the contact with the substrate to increase durability of the protrusion. Further, since the upper layer has wear resistance, a size of the protrusion may be minimized to increase uniformity of a temperature distribution of the substrate supported thereon.

In addition, the protrusion may include a column-shaped supporting portion inside thereof, and extending therethrough, so that the protrusion including the supporting portion may support the substrate more stably while increasing durability of the protrusion. Thus, the size of the protrusion may be further minimized to increase uniformity of the temperature distribution of the substrate supported thereon.

In addition, a porous layer between adjacent protrusions may be on a dielectric layer of the substrate fixing device, and thus a thermal accommodation coefficient of a helium-aluminum oxide dielectric layer may be increased to increase uniformity of the temperature distribution of the substrate supported thereon.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

Figure 1:
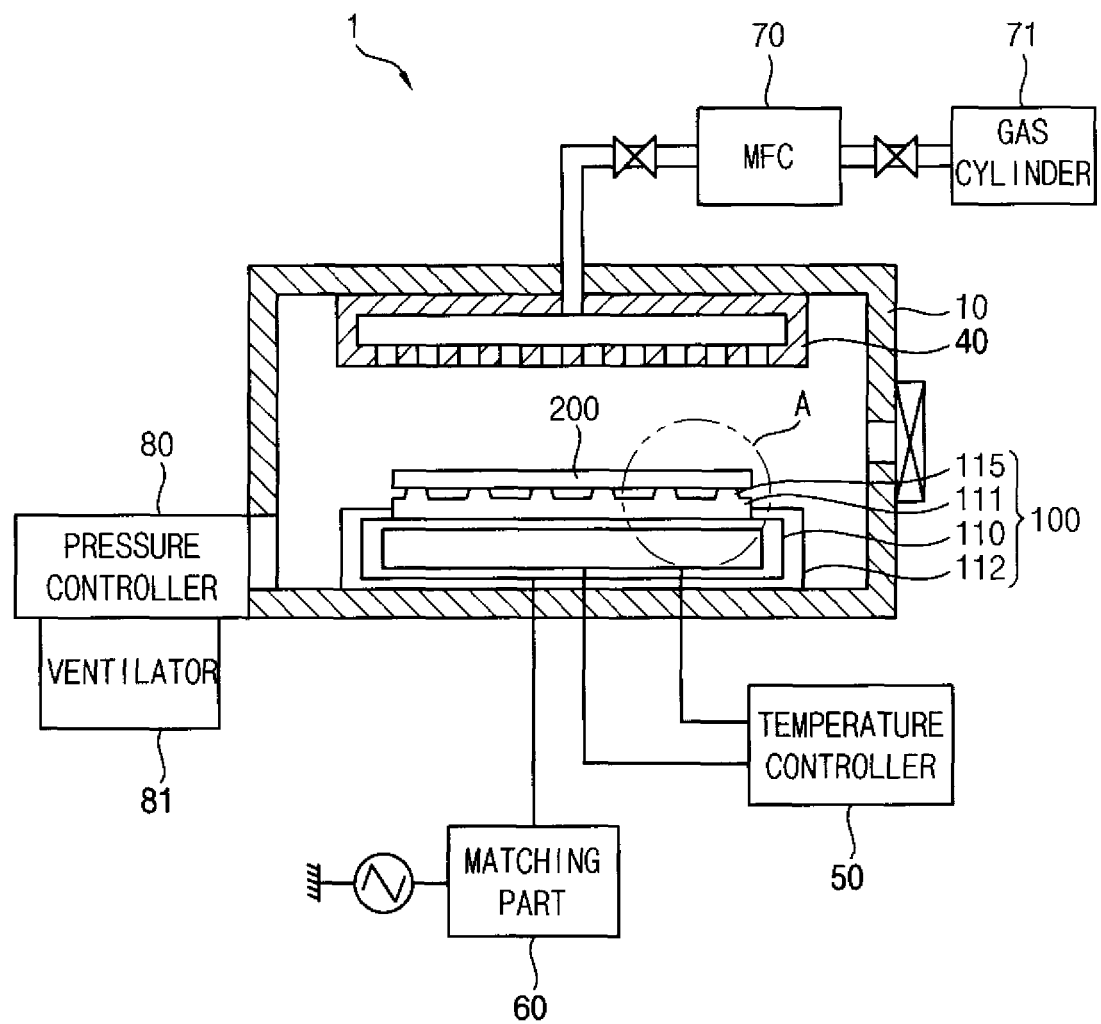
FIG. 1 is a schematic diagram illustrating an exemplary embodiment of a plasma processing device in which a substrate fixing device is equipped according to the invention.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising,"

"includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

In fixing the substrate using an electrostatic chuck, a dielectric substance having high permittivity is disposed between a substrate to be plasma-processed and an electrode of the electrostatic chuck to make a surface contact between the substrate and the dielectric substance. The surface contact between the substrate and the dielectric substance uniformly maintains impedance and a temperature of the substrate. However, even with the surface contact between the substrate and the dielectric substance, a minimal gap may be formed between the substrate and the dielectric substance. An alien substance may be inserted into the minimal gap, however, such alien substrate may undesirably cause non-uniformity of the temperature of the substrate. This non-uniform temperature of the substrate makes the plasma-processed substrate non-uniform.

To promote uniformity of the temperature of the substrate being plasma-processed, a plurality of protrusions having the dielectric substance may be on a surface of a base of the electrostatic chuck to fix the substrate. However, when fixing the substrate using the protrusions, wear of the protrusion decreases durability of the protrusion, and a temperature of the substrate is different between portions at which the protrusions contact the substrate and portions at which the protrusions do not contact the substrate. Therefore, there remains a need for an improved electrostatic chuck which uniformly maintains impedance and a temperature of a substrate being plasma-processed.

Hereinafter, exemplary embodiments of the invention will be described in further detail with reference to the accompanying drawings.

FIG. 1 is a schematic diagram illustrating an exemplary embodiment of a plasma processing device in which a substrate fixing device is equipped according to the invention.

Referring to FIG. 1, the substrate fixing device 100 is equipped inside of a chamber 10 of the plasma processing device 1, and fixes a substrate 200 processed by the plasma processing device 1, such as to maintain a position of the substrate 200 within the chamber 10.

The plasma processing device 1 may process the substrate 200, such as performing a dry etching, chemical vapor deposition ("CVD"), sputtering and so on with respect to the substrate 200.

In one exemplary embodiment, for example, in the plasma processing device 1, an amount of gas generated from a gas cylinder 71 is controlled by a mass flow controller ("MFC") 70 and the gas is provided to the substrate 200 through a radio-frequency generator 40.

The substrate fixing device 100 includes a dielectric layer 111 including a protrusion 115, a lower electrode 110 fixed under the dielectric layer 111, and a cover portion 112 covering the dielectric layer 111 and the lower electrode 110, to fix the substrate 200. A dielectric member may collectively include the dielectric layer 111 and a plurality of protrusions 115. The dielectric layer 111 and the plurality of protrusions 115 may be continuous with each other so as to form a single, unitary, indivisible dielectric member, but is not limited thereto or thereby. A temperature controller 50 and a matching part 60 are connected to the lower electrode 110, to maintain a temperature and an impedance of the lower electrode 110. A pressure controller 80 and a ventilator 81 are disposed at a side of the chamber 10 and are in communication with an inside of the chamber 10, to control a pressure of the chamber 10 and to ventilate the plasma.

Figure 2:
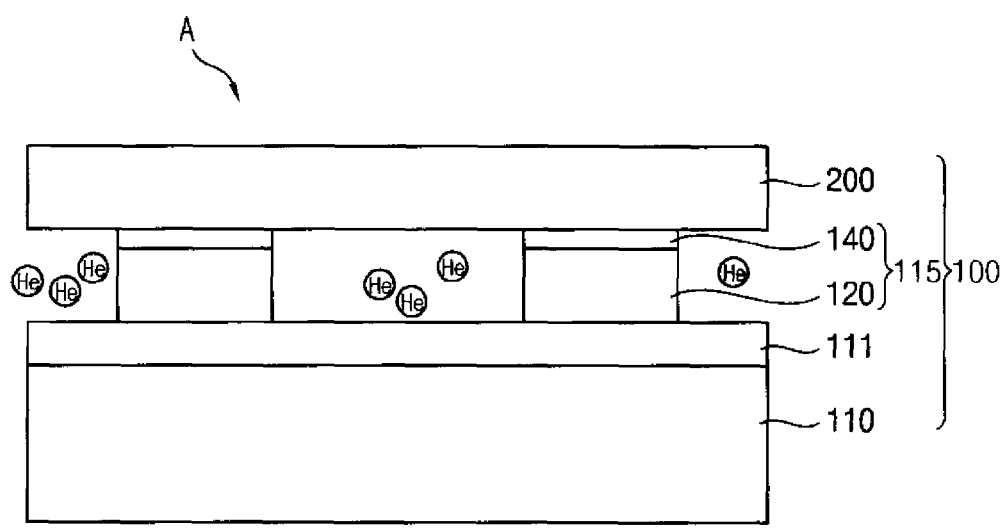
FIG. 2 is an enlarged cross-sectional view illustrating portion "A" in FIG. 1.

FIG. 2 is an enlarged cross-sectional view illustrating portion "A" in FIG. 1.

Referring to FIG. 2, the substrate fixing device 100 includes the lower electrode 110, the dielectric layer 111 and a plurality of protrusions 115, and the substrate 200 is supported by the protrusions 115.

The lower electrode 110 may include aluminum (Al). The dielectric layer 111 is disposed on an upper surface of the lower electrode 110, and may include a dielectric material having high permittivity like aluminum oxide ($Al_2O_3$). Thus, when a voltage is applied to the lower electrode 110, a static electricity is generated between the lower electrode 110 and the substrate 200 to fix the substrate 200 to the protrusions 115.

The protrusions 115 are spaced apart from each other by a predetermined distance on the dielectric layer 111. In addition, the protrusions 115 are protruded from the dielectric layer 111 and support the substrate 200.

In the illustrated exemplary embodiment, each of the protrusions 115 includes an insulating layer 120 and an upper layer 140. The insulating layer 120 is disposed on the dielectric layer 111, and the upper layer 140 is disposed on the insulating layer 120. The insulating layer 120 and the upper layer 140 are arranged in a thickness direction of the protrusion 115. The substrate 200 makes direct contact with the upper layer 140 and is thereby supported by the protrusion 115. The protrusion 115 is substantially column-shaped such as being a square pillar, a cylinder and so on. In addition, a distance between protrusions 115 adjacent to each other, and a cross-sectional area of the protrusion 115 may be optimized such that the substrate 200 is sufficiently supported thereby.

In processing the substrate 200, a temperature of the substrate 200 should be uniformly maintained such that the substrate 200 is uniformly processed. However, where the substrate 200 is supported by the protrusions 115 spaced apart from each other by the predetermined distance, a thermal conductivity relatively increases at portions of the substrate 200 supported by the protrusions 115 compared to portions between the adjacent protrusions 115. Thus, the temperature at the portions of the substrate 200 supported by the protrusions 115 is relatively decreased, and thus the temperature of the substrate 200 may be non-uniform.

In the illustrated exemplary embodiment, to minimize variation of the thermal conductivity of the substrate 200 due to the protrusions 115, the insulating layer 120 includes a material having relatively lower thermal conductivity. In one exemplary embodiment, for example, the insulating layer 120 may include at least one of a porous organic or inorganic material, polytetrafluoroethylene ("PTFE"), polychlorotrifluoroethylene ("PCTFE"), polyvinylidene difluoride ("PVDF"), polyvinyl fluoride ("PVF"), epoxy resin, silicone resin, polyimide resin, polyetherimide ("PEI") and thermal-resisting rubber. A thickness of the insulating layer 120 may be from about 10 micrometers (μm) to about 200 μm, and further may be from about 50 μm to about 100 μm, from an upper surface of the dielectric layer 111. The thickness is taken perpendicular to the plane of the dielectric layer 111.

To minimize wear or distortion due to the direct contact between the upper layer 140 and the substrate 200, the upper layer 140 includes a material having relatively lower thermal conductivity, but does not include a material harder than the insulating layer 120. In one exemplary embodiment, for example, the upper layer 140 may include at least one of aluminum oxide, silicon oxide, carbon compound, boron nitride, titanium (Ti) and molybdenum (Mo).

In addition, a thickness of the upper layer 140 may be from about 0.1 μm to about 30 μm, and further may be from about 1 μm to about 10 μm. Accordingly, the upper layer 140 is thinner than the insulating layer 120, and wear resistance of the protrusion 115 may be increased. Where the wear resistance of the protrusion 115 is increased, thermal conductivity may be minimized to increase the uniformity of the temperature of the substrate 200.

Helium (He) gas is charged in a space between the protrusions 115 adjacent to each other. The temperature of the substrate 200 is maintained relatively low at the portions thereof supported by the protrusions 115, so that thermal conductivity is generated at portions not supported by the protrusions 115 to increase the uniformity of the temperature of the substrate 200. In one exemplary embodiment, for example, since the helium gas is filled with the space between the protrusions 115 and generates the thermal conductivity, the substrate has a uniform temperature gradient at both portions supported and not supported by the protrusions.

Here, the thermal conductivity of the helium gas is lower than that of the protrusions 115, and is proportional to a pressure, so that relatively high pressured helium gas may be charged to maintain substantially the same thermal conductivity as that of the protrusions 115.

FIGS. 3A to 3E are cross-sectional views illustrating an exemplary embodiment of a method for manufacturing the substrate fixing device in FIG. 2.

Figure 3A:
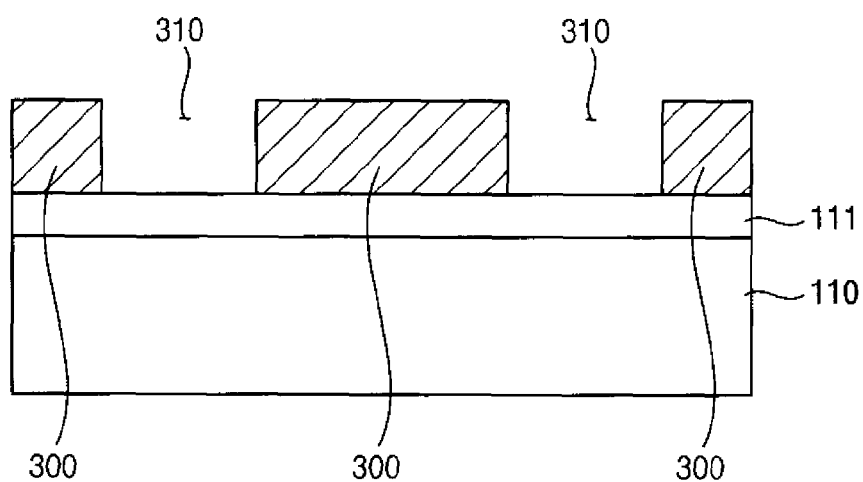
FIGS. 3A to 3E are cross-sectional views illustrating an exemplary embodiment of a method for manufacturing the substrate fixing device in FIG. 2.

Referring to FIG. 3A, the dielectric layer 111 is formed (e.g., provided) on the lower electrode 110. Then, a mask 300 is disposed on the dielectric layer 111. The mask 300 includes opening portions 310 defined therein, and in which the protrusions 115 are formed.

Figure 3B:
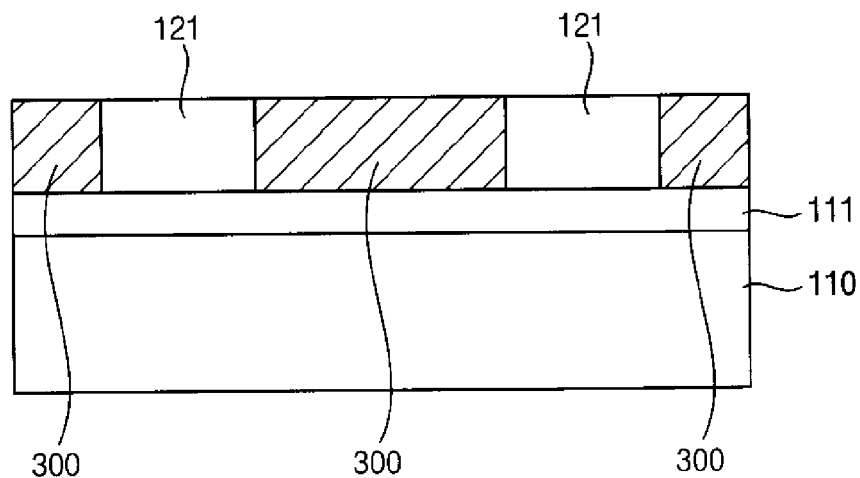

Referring to FIG. 3B, insulating material 121 is disposed, such as by printing, on the dielectric layer 111 including the mask 300 thereon, and thus the insulating material 121 is filled in the opening portions 310 of the mask 300. The insulating material 121, as mentioned above, for example, may include at least one of porous organic or inorganic material, polytetrafluoroethylene ("PTFE"), polychlorotrifluoroethylene ("PCTFE"), polyvinylidene difluoride (PVDF), polyvinyl fluoride (PVF), epoxy resin, silicone resin, polyimide resin, polyetherimide ("PEI") and thermal-resisting rubber. A method for printing the insulating material 121 is explained below referring to FIGS. 4A and 4B.

Figure 3C:
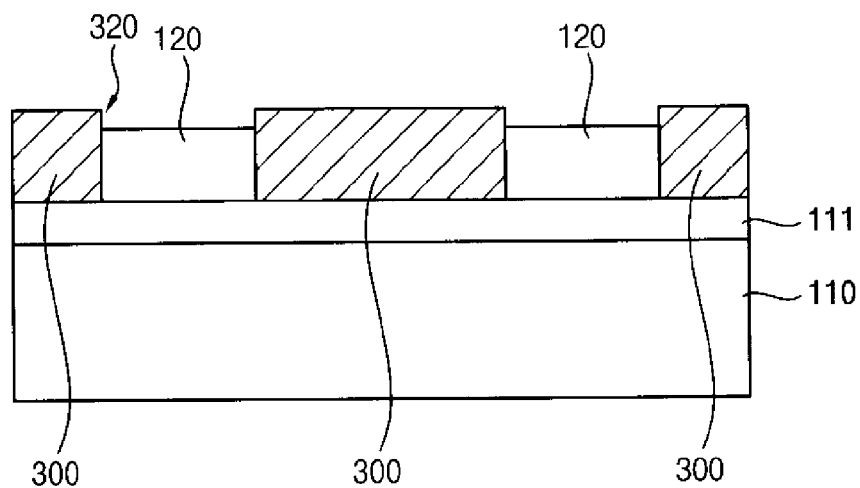

Referring to FIG. 3C, the insulating material 121 filled in the opening portions 310 is dried, so that a solvent included in the insulating material 121 is evaporated. Thus, where the solvent is evaporated from the insulating material 121, a thickness of the insulating material is decreased below a maximum height of the opening portions 310 of the mask 300. The decreased thickness of the insulating material 121 forms the insulating layer 120, which forms a stepped portion 320 with the mask 300 due to the difference in thickness of the mask 300 and the insulating layer 120.

Figure 3D:
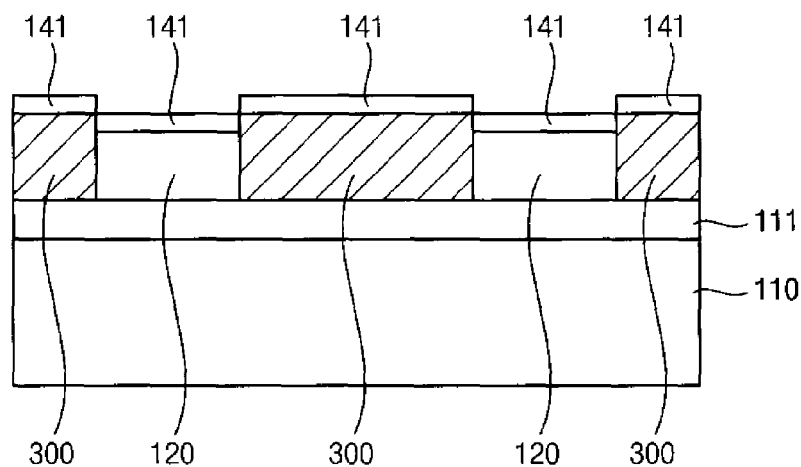

Referring to FIG. 3D, a hard material 141 is formed on the mask 300 and the insulating layer 120. The hard material 141, for example, may include at least one of aluminum oxide, silicon oxide, carbon compound, boron nitride, titanium (Ti) and molybdenum (Mo). The hard material 141 is formed on the mask 300 and the insulating layer 120 with a uniform thickness such as via the sputtering and so on. A portion of the hard material 141 is disposed on an upper surface of the mask 300, and another portion of the hard material 141 is disposed on the insulating layer 120 formed in the opening portions 310.

Figure 3E:
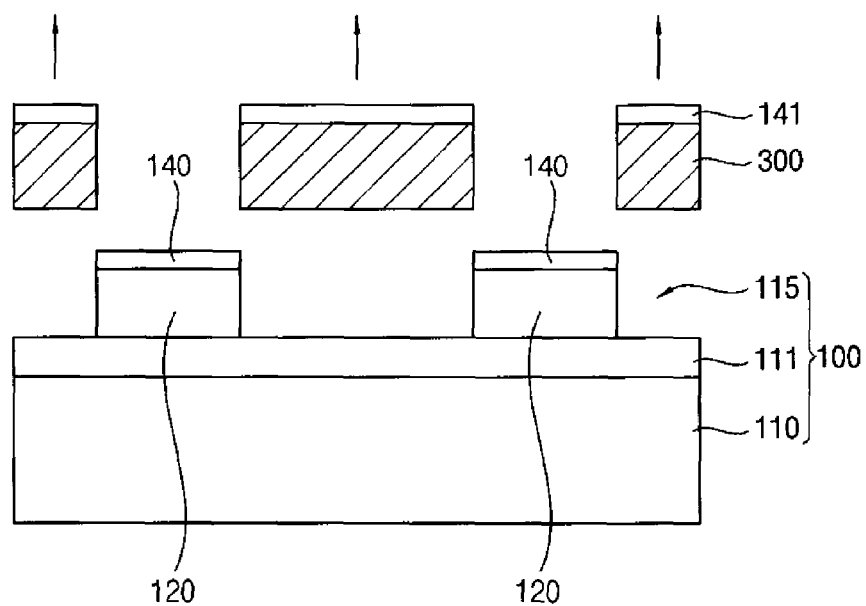

Referring to FIG. 3E, the mask 300 is removed along with the portions of the hard material 141 disposed thereon, while the portions of the hard material layer 141 on the insulating layer 120 remain, to form the protrusions 115. Each of the protrusions 115 includes the insulating layer 120 and the upper layer 140.

Figure 4A:
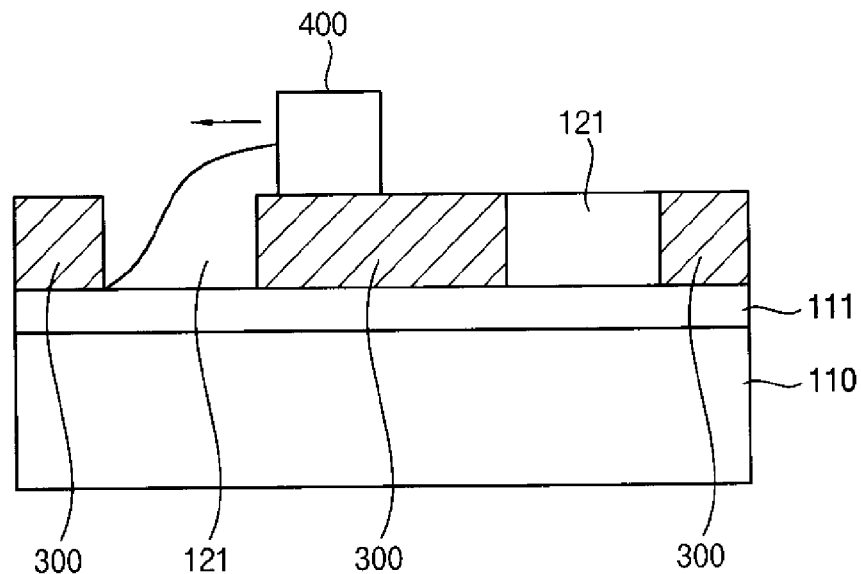
FIGS. 4A and 4B are views showing alternative exemplary embodiment of performing the process in FIG. 3B.
Figure 4B:
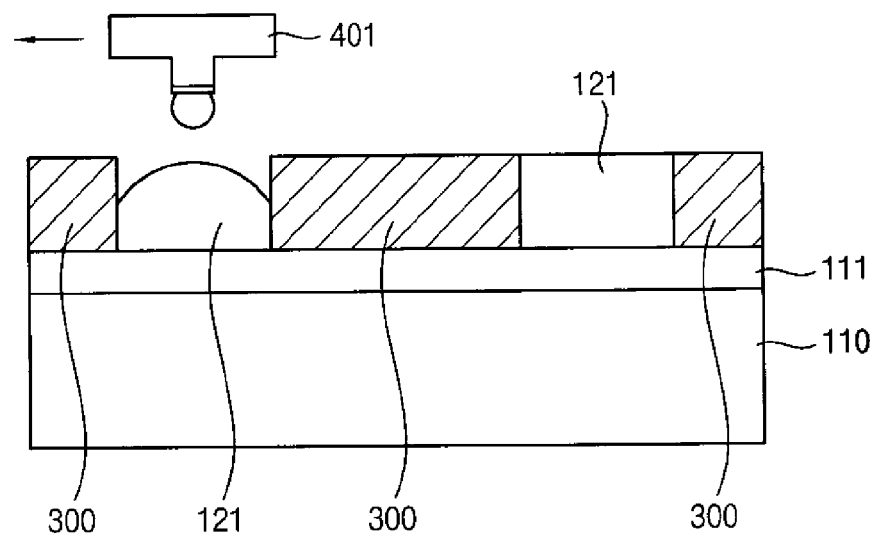

FIGS. 4A and 4B are views showing alternative exemplary embodiments of performing the process in FIG. 3B.

As illustrated in FIG. 4A, the insulating material 121 is filled in the opening portions 310 of the mask 300 via silk screen printing using a silk screen printer 400.

Alternatively, as illustrated in FIG. 4B, the insulating material 121 is dropped and filled in the opening portions 310 of the mask 300 via inkjet printing using a inkjet printer 401.

Figure 5A:
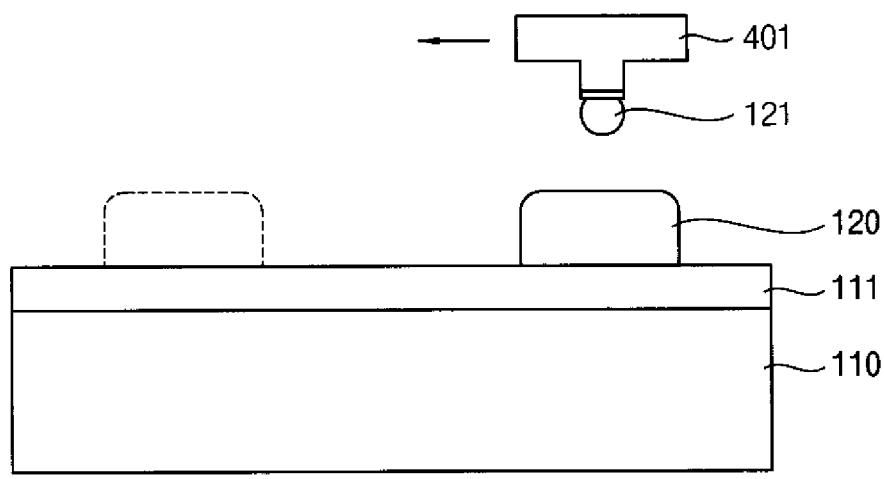
FIGS. 5A and 5B are cross-sectional views illustrating another exemplary embodiment of a method for manufacturing the substrate fixing device in FIG. 2.
Figure 5B:
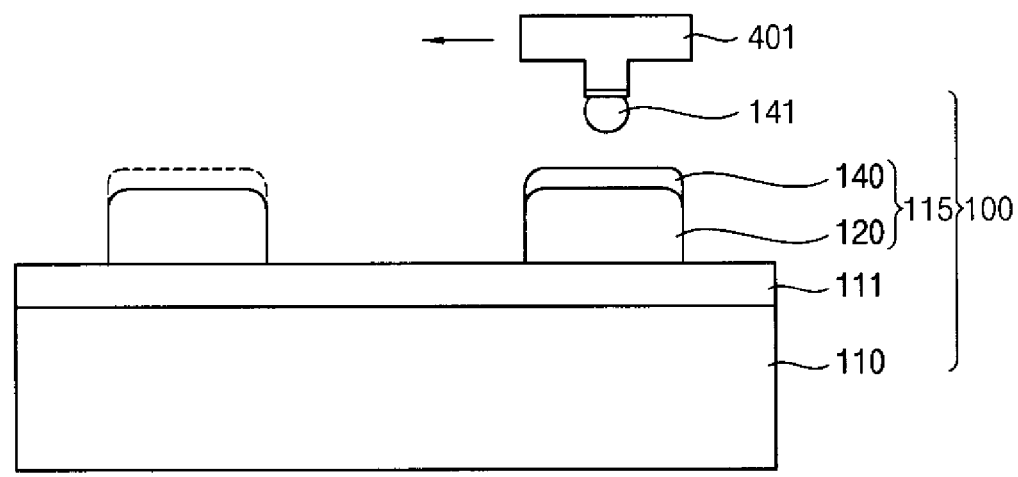

FIGS. 5A and 5B are cross-sectional views illustrating another exemplary embodiment of a method for manufacturing the substrate fixing device in FIG. 2.

In an exemplary embodiment of a method for manufacturing a substrate fixing device 100 shown in FIGS. 5A and 5B, the inkjet printing is used without using the mask 300 as shown in the previous exemplary embodiment referring to FIGS. 3A to 3E.

Referring to FIG. 5A, the dielectric layer 111 is formed (e.g., provided) on the lower electrode 110. Then, the insulating material 121 is dropped at the portions of the dielectric layer 111 at which the protrusions 115 are formed, via the inkjet printing using the inkjet printer 401. Thus, the insulating layer 120 is formed at the predetermined positions of the dielectric layer 111.

Here, the dropped insulating material 121 via the inkjet printing forms the insulating layer 120 having a rounded upper corner in a cross-sectional view of the insulating layer 120, which may be considered a form error. To minimize such a form error, an amount of the insulating material 121 dropped from the inkjet printer 401 is minimized.

Referring to FIG. 5B, the hard material 141 is dropped at the portions of the dielectric layer 111 including the insulating layer 120, via the inkjet printing using the inkjet printer 401. Thus, the upper layer 140 is formed on the insulating layer 120. As similarly discussed above, to decrease a form error of the upper layer 140, an amount of the hard material 141 dropped from the inkjet printer 401 is minimized.

In the illustrated exemplary embodiment, the mask is not used such that a cost for manufacturing may be decreased with a relatively simplified process.

Figure 6:
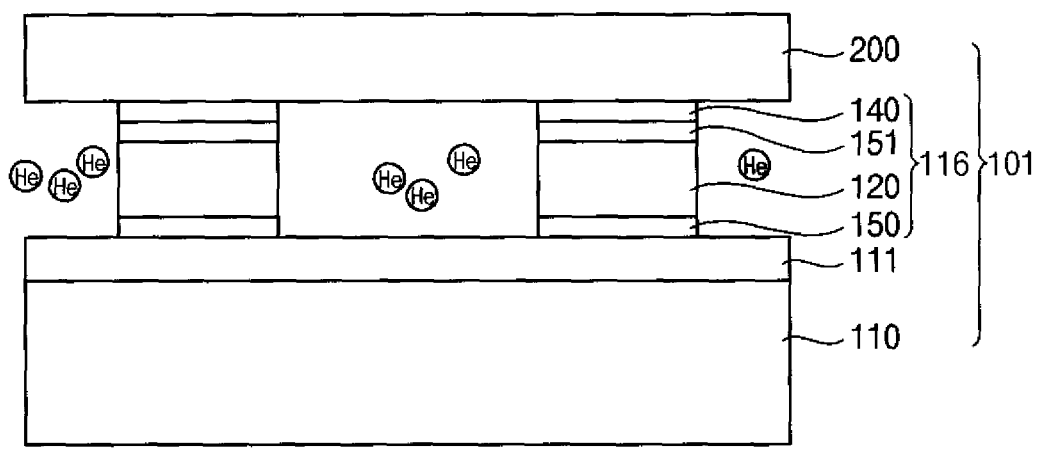
FIG. 6 is a cross-sectional view illustrating another exemplary embodiment of a substrate fixing device according to the invention.

FIG. 6 is a cross-sectional view illustrating another exemplary embodiment of a substrate fixing device according to the invention.

The substrate fixing device 101 according to the illustrated exemplary embodiment is substantially the same as the substrate fixing device 100 in FIG. 2, except for first and second adhesive layers. Thus, same reference numerals are used for same elements and any repetitive explanation will be omitted.

Referring to FIG. 6, protrusions 116 of the substrate fixing device 101 further include a first adhesive layer 150 disposed between the insulating layer 120 and the dielectric layer 111. The first adhesive layer 150 increases an adhesive strength between the insulating layer 120 and the dielectric layer 111, to increase durability of the protrusions 116.

In addition, the protrusions 116 of the substrate fixing device 101 may further include a second adhesive layer 151 disposed between the insulating layer 120 and the upper layer 140. The second adhesive layer 151 increases the adhesive strength between the upper layer 140 and the insulating layer 120, to increase durability of the protrusion 116. The insulating layer 120, the upper layer 140, the first adhesive layer 150 and the second adhesive layer 151 are arranged in a thickness direction of the protrusion 116.

Although not shown in the figures, a method for manufacturing the substrate fixing device 101 according to the illustrated exemplary embodiment, is substantially the same as the method mentioned in FIGS. 3A to 3E or in FIGS. 5A and 5B, except for further forming the first and second adhesive layers 150 and 151. Thus, same reference numerals are used for same elements and any repetitive explanation will be omitted.

Although not shown in FIGS. 3A to 3E, the first adhesive layer 150 of the protrusion 116 may be formed on the dielectric layer 111 including the mask 300 thereon, before the disposing, such as by printing, the insulating layer 121 in the opening portions 310 of the mask 300. In one exemplary embodiment, for example, after forming an adhesive material on the dielectric layer 111 on which the mask 300 is disposed and removing the mask 300 as illustrated in FIG. 3E, the first adhesive layer 150 may be formed between the dielectric layer 111 and the insulating layer 120. Here, the adhesive material may be disposed via spin coating, sputtering, spread coating and so on.

In addition, when the protrusion 116 further includes the second adhesive layer 151, the second adhesive layer 151 may be formed as followed. In one exemplary embodiment, for example, after drying the insulating material 121 to form the insulating layer 120, an adhesive material is disposed on the insulating layer 120 in the opening portions 310 of the mask, with a substantially constant thickness such as via spin coating, sputtering, spread coating and so on. Here, the adhesive material disposed on the insulating layer 1120 may form the second adhesive layer 151 on the insulating layer 120. The hard material 141 is formed on the second adhesive layer 151 on the second insulating layer 120 referring to FIG. 3D, and the mask 300 is removed as illustrated in FIG. 3E, to form the second adhesive layer 151 between the insulating layer 120 and the upper layer 140.

Alternatively, not shown in the figures, the first adhesive layer 150 formed between the dielectric layer 111 and the insulating layer 120 may be formed via dropping the adhesive material at the predetermined positions of the dielectric layer 111 using the inkjet printer 401. In addition, before forming the upper layer 140 in FIG. 5B, the adhesive material is formed on the insulating layer 120 via inkjet printing using the inkjet printer 401 to form the second adhesive layer 151 between the insulating layer 120 and the upper layer 140.

Figure 7:
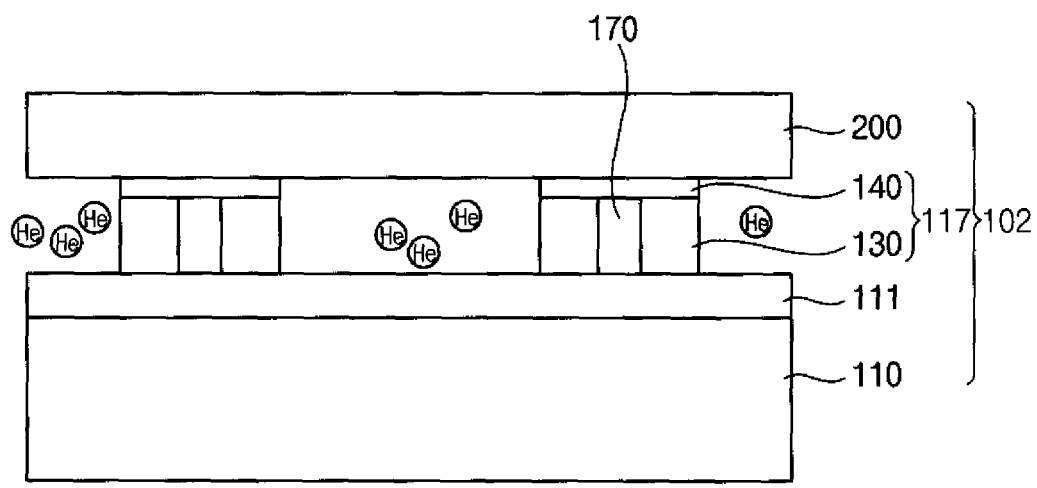
FIG. 7 is a cross-sectional view illustrating still another exemplary embodiment of a substrate fixing device according to the invention.

FIG. 7 is a cross-sectional view illustrating still another exemplary embodiment of a substrate fixing device according to the invention.

The substrate fixing device 102 according to the illustrated exemplary embodiment is substantially the same as the substrate fixing device 100 in FIG. 2, except that a supporting portion 170 is disposed at a central portion of a protrusion 117. Thus, same reference numerals are used for same elements and any repetitive explanation will be omitted.

Referring to FIG. 7, the substrate fixing device 102 according to the illustrated exemplary embodiment includes the lower electrode 110, the dielectric layer 111 disposed on the lower electrode and a plurality of protrusions 117 spaced apart from each other by a predetermined distance and protruded from the dielectric layer 111.

Each of the protrusions 117 includes an insulating layer 130 disposed on the dielectric layer 111, the upper layer 140 disposed on the insulating layer 130 and making direct contact with the substrate 200, and the supporting portion 170 extended through the insulating layer 130 in a thickness direction of the protrusion 117. The insulating layer 130 and the supporting portion 170 may be arranged in a direction perpendicular to the thickness direction of the protrusion 117, such as in a direction parallel with the plane of the dielectric layer 111.

The supporting portion 170 extends from the dielectric layer 111 and through the insulating layer 130. An upper surface of the supporting portion 170 makes contact with the upper layer 140. The supporting portion 170 extends through a central portion of the insulating layer 130, and is substantially column-shaped such as being a square pillar, a cylinder and so on. The supporting portion 170 includes a substantially same material as the dielectric layer 111, and, for example, may include a dielectric material having high permittivity like aluminum oxide ($Al_2O_3$).

Accordingly, the supporting portion 170 is disposed at the central portion of the protrusion 117, and thus the protrusion 117 supporting the substrate 200 may have an increased strength. Since the protrusion 117 including the supporting portion 170 has increased strength, deformation of the protrusion 117 is decreased and the substrate fixing device 102 has increased durability.

Further, in the illustrated exemplary embodiment, the helium gas is charged in the space between adjacent protrusions 117 to increase the uniformity of the temperature distribution along the substrate 200.

FIG. 8A to 8F are cross-sectional views illustrating an exemplary embodiment of a method for manufacturing the substrate fixing device in FIG. 7.

Figure 8A:
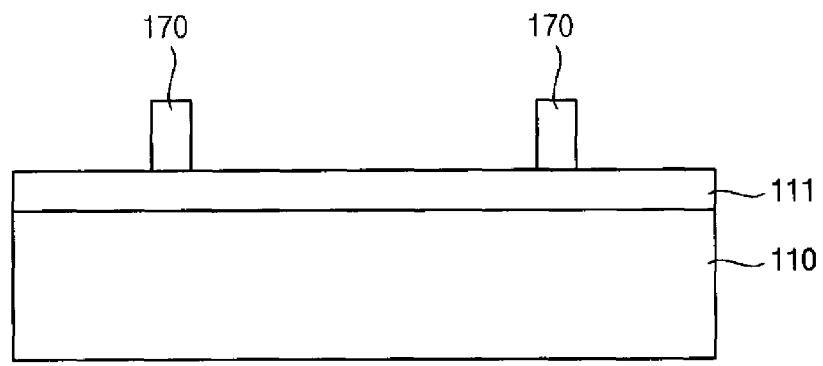
FIG. 8A to 8F are cross-sectional views illustrating an exemplary embodiment of a method for manufacturing the substrate fixing device in FIG. 7.

Referring to FIG. 8A, the dielectric layer 111 is formed (e.g., provided) on the lower electrode 110. The supporting portions 170 spaced apart from each other by a predetermined distance are formed on the dielectric layer 111. Although not shown in figures, a first mask having first opening portions defined therein at which the supporting portions 170 are formed is disposed on the dielectric layer 111, aluminum oxide is coated via screen printing, spread coating, spin coating and so on, and the first mask is removed, to form the supporting portions 170.

Figure 8B:
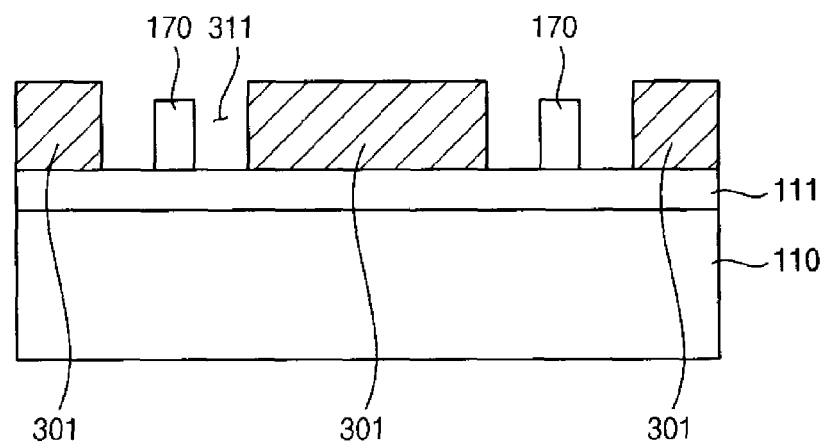

Referring to FIG. 8B, a second mask 301 is formed on the dielectric layer 111 including the supporting portions 170. Here, the supporting portions 170 are respectively inserted in second opening portions 311 defined in the second mask 301.

In addition, the supporting portions 170 are respectively disposed at central portions of the second opening portions 311 of the second mask 301, such that the supporting portions 170 are formed at the central portion of the protrusion 117.

Figure 8C:
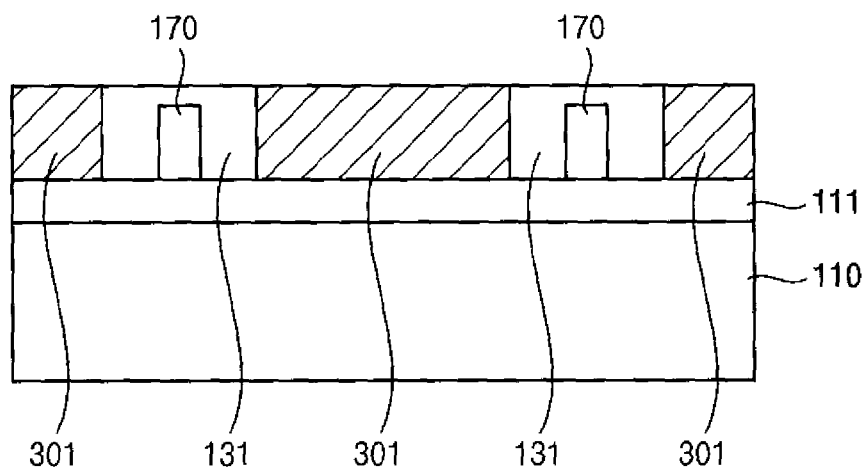

Referring to FIG. 8C, insulating material 131 is disposed, such as by printing, on the dielectric layer 111 including the second mask 301, and unoccupied spaces of the second opening portions 311 of the second mask 301 are filled with the insulating material 131. The insulating material 131 includes a material having relatively lower heat conductivity, and, for example, may include at least one of porous organic or inorganic material, polytetrafluoroethylene ("PTFE"), polychlorotrifluoroethylene ("PCTFE"), polyvinylidene difluoride ("PVDF"), polyvinyl fluoride ("PVF"), epoxy resin, silicone resin, polyimide resin, polyetherimide ("PEI") and thermal-resisting rubber. Here, the insulating material 131, as explained in FIGS. 4A and 4B, is printed via silk screen printing or inkjet printing.

When the insulating material 131 is dried, a thickness thereof is reduced below a maximum height of the opening portions 311 of the second mask 301, such that the height of the second mask 301 may be larger than a height of the supporting portion 170.

Figure 8D:
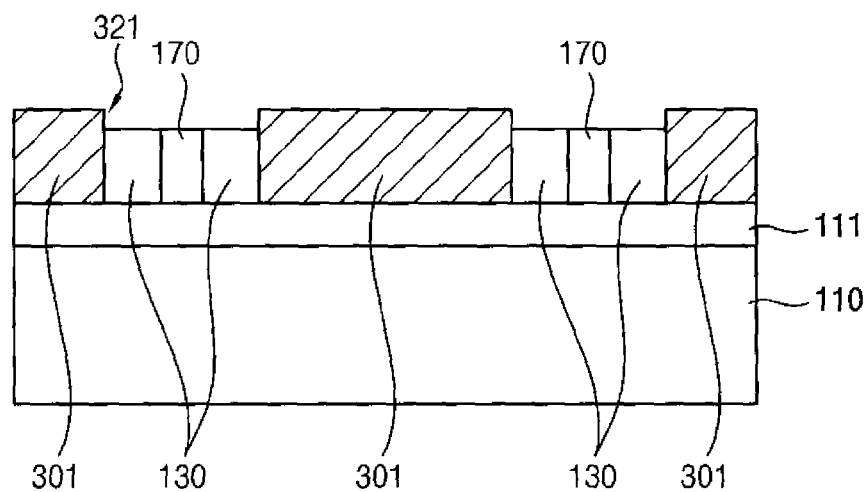

In one exemplary embodiment, for example, referring to FIG. 8D, the insulating material 131 filled within the second opening portion 311 of the second mask 301 is dried to evaporate a solvent included in the insulating material 131. Thus, the dried insulating material, which forms the insulating layer 130, forms a stepped portion 321 with the second mask 301.

Here, since material of the supporting portion 170 does not include the solvent, a volume of the supporting portion 170 is maintained after the drying process applied to the insulating material 131. Thus, as illustrated in FIG. 8C, a height of the second mask 301 remains larger than that of the supporting portion 170, so that an upper surface of the undried insulating material 131 is substantially aligned (e.g., substantially coplanar) with an upper surface of the supporting portion 170. Referring again to FIG. 8D, for example, when the insulating material 131 is dried and a thickness thereof is reduced, the upper surface of the supporting portion 170 is exposed to outside the second opening portion 311.

Accordingly, the insulating layer 130 and the supporting portion 170 have the aligned upper surfaces, and form the stepped portion 321 with the second mask 301.

Figure 8E:
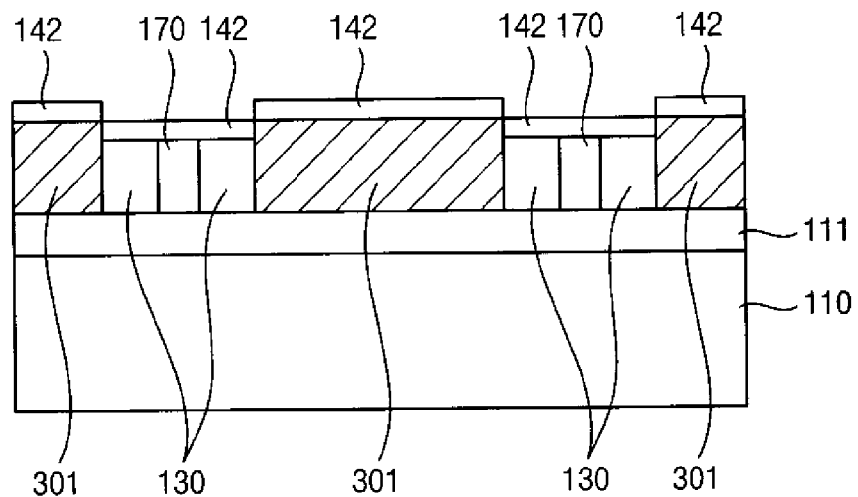

Referring to FIG. 8E, a hard material 142 is formed on the second mask 301, the insulating layer 130 and the supporting portion 170. In one exemplary embodiment, for example, the hard material 142 may include at least one of aluminum oxide, silicon oxide, carbon compound, boron nitride, titanium (Ti) and molybdenum (Mo). The hard material 142 may be formed on the second mask 301, the insulating layer 130 and the supporting portion 170 with a constant thickness, such as via sputtering and so on. A portion of the hard material 142 is disposed on an upper surface of the second mask 301, and another portion of the hard material 142 is disposed on the insulating layer 120 formed in the opening portions 311.

Figure 8F:
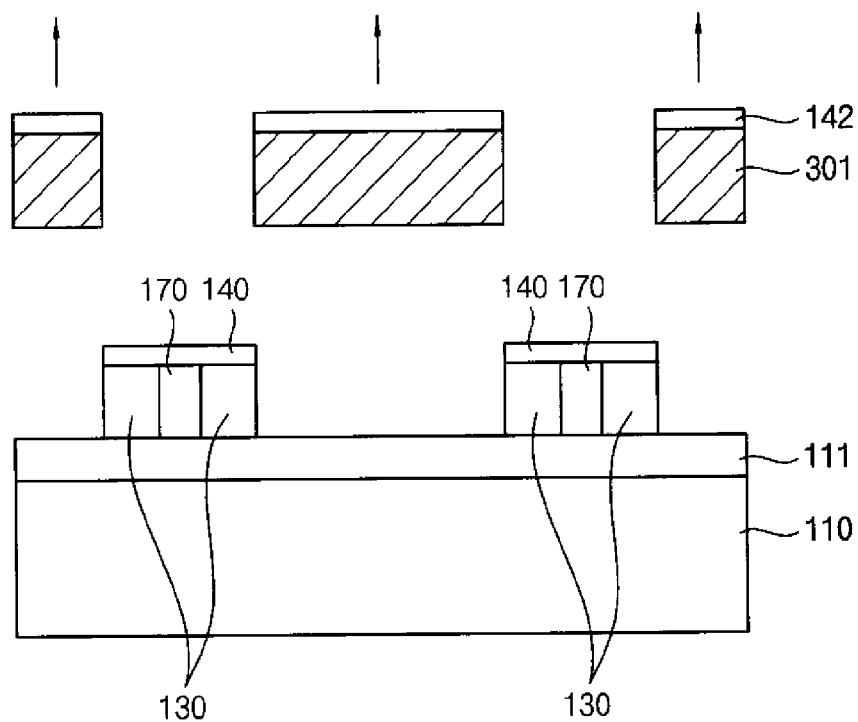

Referring to FIG. 8F, the second mask 301 is removed along with the portions of the hard material 142 disposed thereon, while the portions of the hard material layer 142 on the insulating layer 120 remain, to form a plurality of protrusions 117, each including the insulating layer 130, the supporting portion 170 and the upper layer 140.

Although, not shown in figures, the substrate fixing device 102 according to the illustrated exemplary embodiment may be formed via the inkjet printing as explained in FIGS. 5A and 5B.

In one exemplary embodiment, for example, the insulating material 131 is dropped on the dielectric layer 111 including the supporting portions 170 using the inkjet printer 401, to form the insulating layer 130. Then, the hard material 142 is dropped on the insulating layer 130 and the supporting portion 170 using the inkjet printer 401, to form the upper layer 140.

Accordingly, the protrusions 117 are formed via the inkjet printing without using a mask, and thus a manufacturing process may be simplified and a cost thereof may be decreased.

Figure 9:
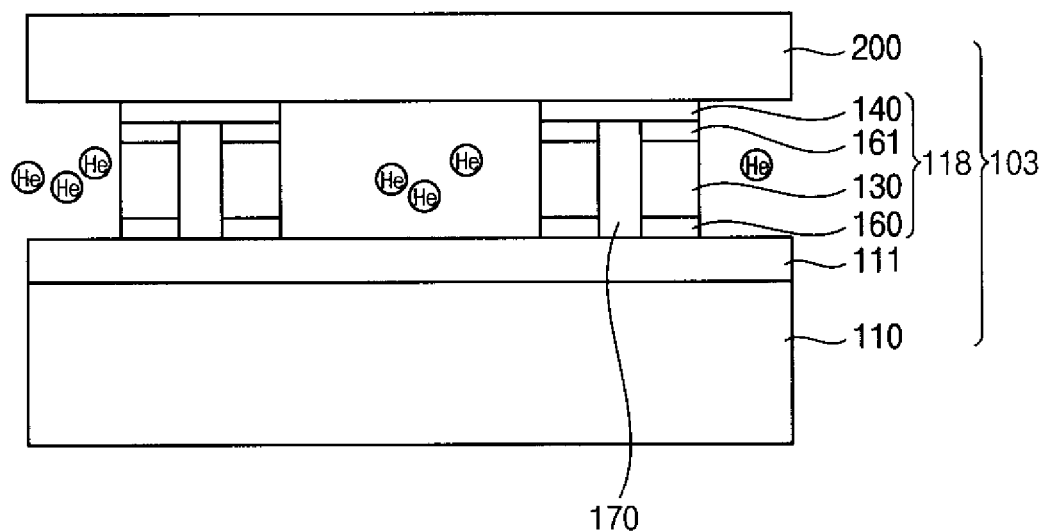
FIG. 9 is a cross-sectional view illustrating still another exemplary embodiment of a substrate fixing device according to the invention.

FIG. 9 is a cross-sectional view illustrating still another exemplary embodiment of a substrate fixing device according to the invention.

The substrate fixing device 103 according to the illustrated exemplary embodiment is substantially the same as the substrate fixing device 102 in FIG. 7, except for first and second adhesive layers. Thus, same reference numerals are used for same elements and any repetitive explanation will be omitted.

Referring to FIG. 9, the protrusion 118 of the substrate fixing device 103 further includes a first adhesive layer 160 between the insulating layer 130 and the dielectric layer 111. The first adhesive layer 160 increases an adhesive strength between the insulating layer 130 and the dielectric layer 111, to increase durability of the protrusion 118. The supporting portion 170 extends from the dielectric layer 111 and through the first adhesive layer 160 to be disposed in the protrusion 118.

In addition, the protrusion 118 of the substrate fixing device 103 may further include a second adhesive layer 161 disposed between the insulating layer 130 and the upper layer 140. The second adhesive layer 161 increases an adhesive strength between the upper layer 140 and the insulating layer 130, to increase durability of the protrusion 118. The supporting portion 170 extends from the dielectric layer 111 and through the second adhesive layer 161 to be disposed in the protrusion 118.

Alternatively, although not shown in figures, the supporting portion 170 may not pass through the second adhesive layer 161, and an upper surface of the supporting portion 170 may only make contact with a lower surface of the second adhesive layer 161.

A method for manufacturing the substrate fixing device 103 according to the illustrated exemplary embodiment is substantially the same as the method in FIGS. 8A to 8F, except for forming the first and second adhesive layers 160 and 161. Thus, same reference numerals are used for same elements and any repetitive explanation will be omitted.

In one exemplary embodiment, for example, although not shown in FIGS. 8A to 8F, the first adhesive layer 160 may be formed on the dielectric layer 111 using an additional mask, so that the supporting portion 170 extends through the first adhesive layer 160. Here, the adhesive material may be spin-coated, sputtered, or spread-coated to form the first adhesive layer 160.

In addition, the second adhesive layer 161 may be formed on the insulating layer 130 using an additional mask, after the drying process in FIG. 8D. Here, the supporting portion 170 may pass through the second adhesive layer 161 or the upper surface of the supporting portion 170 may only make contact with the lower surface of the second adhesive layer 161. The adhesive material may be spin-coated, sputtered, or spread-coated to form the second adhesive layer 161.

Alternatively, the substrate fixing device 103 according to the illustrated exemplary embodiment may be formed via the inkjet printing as mentioned in FIGS. 5A and 5B. In one exemplary embodiment, for example, the first adhesive layer 160, the insulating layer 130, the second adhesive layer 161 and the upper layer 140 are sequentially formed on the dielectric layer 111 via the inkjet printing, to form the protrusion 118.

Figure 10:
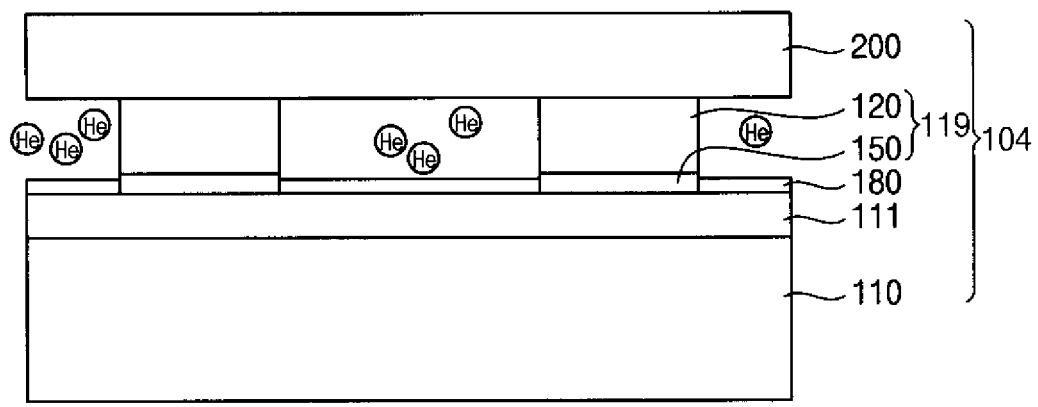
FIG. 10 is a cross-sectional view illustrating still another exemplary embodiment of a substrate fixing device according to the invention.

FIG. 10 is a cross-sectional view illustrating still another exemplary embodiment of a substrate fixing device according to the invention.

The substrate fixing device 104 according to the illustrated exemplary embodiment is substantially the same as the substrate fixing device 100 in FIG. 2, except for including a porous layer and omitting an upper layer. Thus, same reference numerals are used for same elements and any repetitive explanation will be omitted.

Referring to FIG. 10, the substrate fixing device 104 includes the lower electrode 110, the dielectric layer 111 disposed on the lower electrode 110, a porous layer 180 disposed on the dielectric layer 111, and a plurality of protrusions 119 spaced apart from each other and protruding from the dielectric layer 111.

The porous layer 180 is disposed on the dielectric layer 111 except for portions at which the protrusions 119 are formed. The porous layer 180 includes a number of pores defined inside thereof. Since the porous layer 180 is disposed on the dielectric layer 111, the heat conductivity of the helium gas charged in the space between the protrusions 119 may be increased. Thus, the temperature distribution of the substrate 200 is uniformly maintained, at both the portions supported by the protrusion 119 and the portions not supported by the protrusions.

The porous layer 180 may include ceramic or carbon nanotube. In one exemplary embodiment, for example, for the porous layer 180 including the ceramic, a porosity may be more than about 30%, and a thickness thereof may be more than about 1 μm. However, for the porous layer 180 including the carbon nanotube, a porosity may be more than about 90%, and a thickness may be more than about 0.1 μm.

Each of the protrusions 119 may include the insulating layer 120 disposed on the dielectric layer 111, and may further include the first adhesive layer 150 disposed between the dielectric layer 111 and the insulating layer 120.

FIGS. 11A to 11D are cross-sectional views illustrating an exemplary embodiment of a method for manufacturing the substrate fixing device in FIG. 10.

Figure 11A:
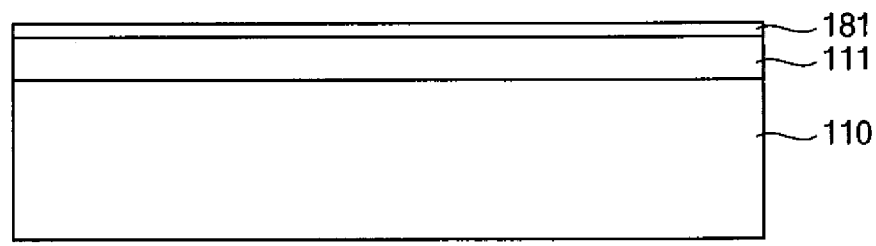
FIGS. 11A to 11D are cross-sectional views illustrating an exemplary embodiment of a method for manufacturing the substrate fixing device in FIG. 10.

Referring to FIG. 11A, the dielectric layer 111 is formed (e.g., disposed) on the lower electrode 110. Then, the porous layer 180 is formed on dielectric layer 111.

In one exemplary embodiment, a suspension 181 having a ceramic fine particle and a solvent is coated on the dielectric layer 111, and then the suspension is sintered to form the porous layer 180. The ceramic fine particle, for example, may be aluminum oxide ($Al_2O_3$), zirconium dioxide ($ZrO_2$), yttrium oxide ($Y_2O_3$), silicon carbide (SiC), silicon dioxide ($SiO_2$), cerium oxide ($CeO_2$), titanium dioxide ($TiO_2$), boron nitride (BN), and so on.

Alternatively, one or more carbon nanotube may be grown on the dielectric layer 111 such as using chemical vapor deposition, to form the porous layer 180.

Figure 11B:
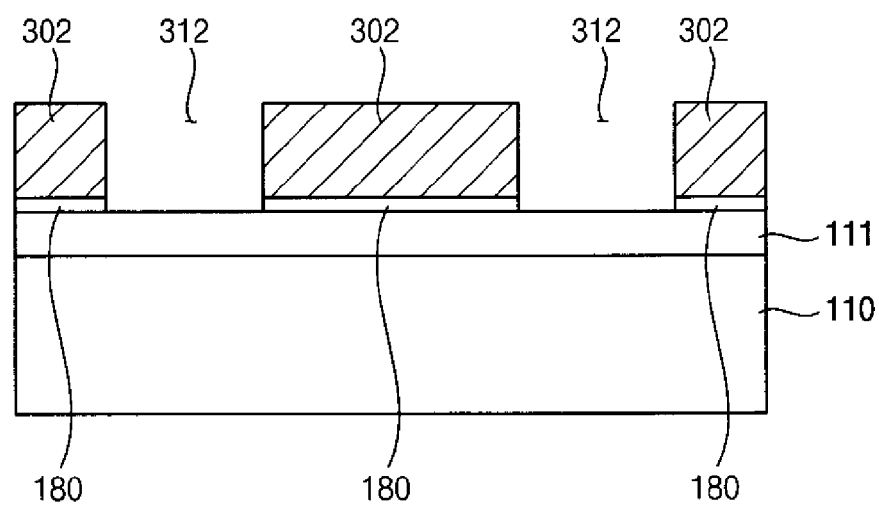

Referring to FIG. 11B, a mask 302 having opening portions 312 defined therein at which the protrusions 119 are formed is disposed over the porous layer 180, and then the porous layer 180 exposed by the opening portions 312 are partially removed.

Figure 11C:
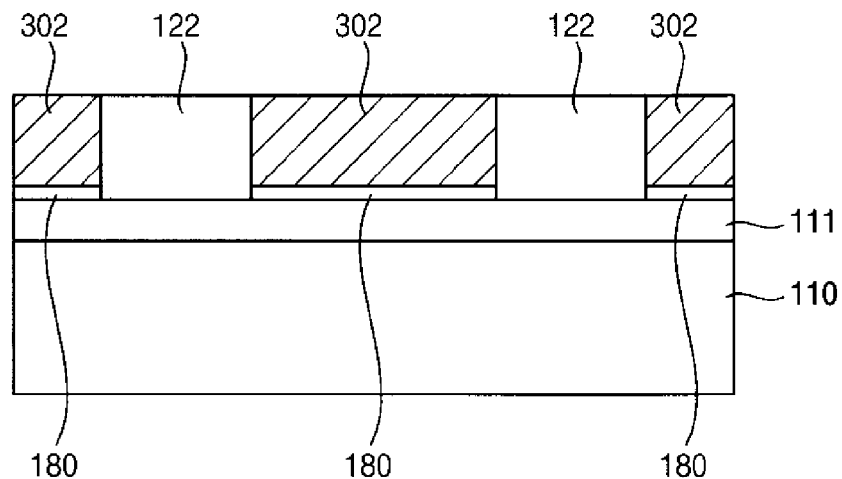

Referring to FIG. 11C, insulating material 122 is disposed, such as by printing, in the opening portions 312 of the mask 302 excluding the porous layer 180 therein. Here, the insulating material 122 may be printed via the silk screen printing or the inkjet printing as mentioned in FIGS. 4A and 4B.

Figure 11D:
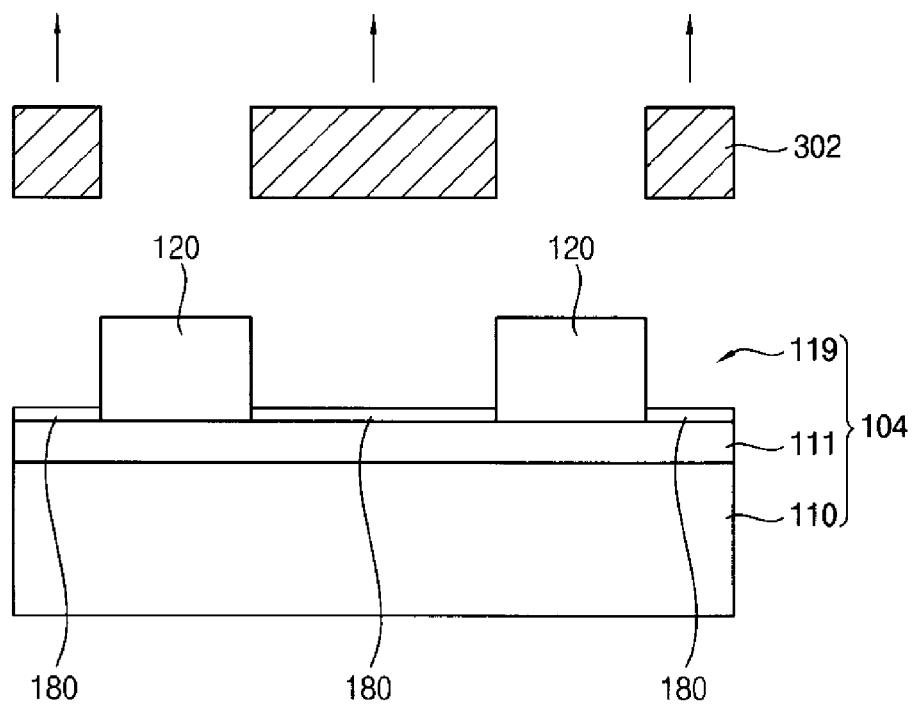

Referring to FIG. 11D, the insulating material 122 is dried and the mask 302 is removed, to form the protrusion 119 having the insulating layer 120.

Although not shown in figures, before forming the insulating material 122 in FIG. 11B, an adhesive material is formed in the opening portions 312 on the dielectric layer 111, to form the first adhesive layer 150 between the insulating layer 120 and the dielectric layer 111.

According to one or more exemplary embodiment of the invention, a protrusion of a substrate fixing device includes an upper layer making contact with a substrate supported by the substrate fixing device. Since the upper layer includes a hard material, wear of the upper layer may be decreased from making contact with the substrate to increase durability of the protrusion. Further, since the upper layer has wear resistance, a size of the protrusion may be minimized to increase uniformity of a temperature distribution of the substrate supported thereon.

In addition, the protrusion may include a column-shaped supporting portion inside thereof and extending therethrough, so that the protrusion including the supporting portion may support the substrate more stably while increasing durability of the protrusion. Thus, the size of the protrusion may be further minimized to increase uniformity of the temperature distribution of the substrate supported thereon.

In addition, a porous layer between adjacent protrusions may be on a dielectric layer of the substrate fixing device, and thus a thermal accommodation coefficient of a helium-aluminum oxide dielectric layer may be increased to increase uniformity of the temperature distribution of the substrate supported thereon.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A substrate fixing device comprising:
    a lower electrode;
    a dielectric layer including:
        a first surface on which the lower electrode is disposed, and
        a second surface which is opposite to the first surface; and
    a plurality of protrusions spaced apart from each other, and protruded from the second surface of the dielectric layer, wherein each protrusion comprises:
        an insulating layer on the dielectric layer; and
        an upper layer on the insulating layer and contacting a substrate.

2. The substrate fixing device of claim 1, wherein the upper layer comprises at least one of aluminum oxide, silicon oxide, carbon compound, boron nitride, titanium and molybdenum.

3. The substrate fixing device of claim 2, wherein the each protrusion further comprises a first adhesive layer between the dielectric layer and the insulating layer.

4. The substrate fixing device of claim 3, wherein the each protrusion further comprises a second adhesive layer between the insulating layer and the upper layer.

5. The substrate fixing device of claim 1, wherein the each protrusion further comprises a supporting portion extending from the dielectric layer and through the insulating layer.

6. The substrate fixing device of claim 5, wherein the supporting portion comprises a substantially same material as the dielectric layer.

7. The substrate fixing device of claim 6, wherein the each protrusion further comprises a first adhesive layer between the dielectric layer and the insulating layer, and a second adhesive layer between the insulating layer and the upper layer,
wherein the supporting portion extends through the first and second adhesive layers.

8. The substrate fixing device of claim 1, wherein
the lower electrode comprises aluminum,
the dielectric layer comprises aluminum oxide, and
the insulating layer comprises at least one of porous organic or inorganic material, polytetrafluoroethylene, polychlorotrifluoroethylene, polyvinylidene difluoride, polyvinyl fluoride, epoxy resin, silicone resin, polyimide resin, polyetherimide and thermal-resisting rubber.

9. The substrate fixing device of claim 1, further comprising helium gas which is charged between adjacent protrusions.

10. A substrate fixing device comprising:
a lower electrode;
a dielectric layer including:
   a first surface on which the lower electrode is disposed; and
   a second surface which is opposite to the first surface;
a porous layer disposed on the second surface of the dielectric layer; and
a plurality of protrusions spaced apart from each other, and protruding from the second surface of the dielectric layer and through the porous layer,
wherein each protrusion comprises an insulating layer on the dielectric layer.

11. The substrate fixing device of claim 10, wherein the porous layer comprises ceramic or a carbon nanotube.

12. The substrate fixing device of claim 10, wherein the each protrusion further comprises an adhesive layer between the dielectric layer and the insulating layer.

13. A method for manufacturing a substrate fixing device, the method comprising:
providing a dielectric layer on a lower electrode;
providing a mask including an opening portion defined therein, on the dielectric layer;
providing an insulating material in the opening portion defined in the mask;
drying the insulating material provided in the opening portion, to form a stepped portion between the mask and the insulating material;
providing a hard material on the mask and the insulating material; and
removing the mask to form a protrusion comprising an insulating layer comprising the insulating material and an upper layer comprising the hard material.

14. The method of claim 13, wherein the providing an insulating material comprises a silk screen printing process or an inkjet printing process.

15. The method of claim 13, wherein the providing a hard material comprises a sputtering process.

16. The method of claim 13, further comprising providing a first adhesive material on the mask and the dielectric layer, before the providing an insulating material.

17. The method of claim 16, further comprising providing a second adhesive material on the mask and the dielectric layer, before the providing a hard material.

18. The method of claim 13, further comprising providing a supporting portion on the dielectric layer, before the providing an insulating material on the dielectric layer,
wherein the providing a mask disposes the supporting portion in the opening portion of the mask.

19. The method of claim 18, wherein in the forming a stepped portion between the mask and the insulating material, the supporting portion is exposed.

20. A method for manufacturing a substrate fixing device, the method comprising:
providing a lower electrode on a first surface of a dielectric layer;
providing an insulating material on a predetermined position of the dielectric layer, to form an insulating layer of a plurality of protrusions spaced apart from each other on a second surface of the dielectric layer which is opposite to the first surface; and
providing a hard material on the insulating layer, to form an upper layer of the protrusions.

21. The method of claim 20, further comprising:
providing a first adhesive material on the predetermined position of the dielectric layer to form a first adhesive layer of the protrusions, before the forming an insulating layer of the protrusions.

22. The method of claim 21, further comprising:
providing a second adhesive material on the insulating layer to form a second adhesive layer of the protrusions, before the forming an upper layer of the protrusions.

23. A method for manufacturing a substrate fixing device, the method comprising:
providing a dielectric layer on a lower electrode;
providing a porous layer on the dielectric layer;
providing a mask on the porous layer on the dielectric layer, and partially removing the porous layer using the mask;
providing an insulating material in an opening portion of the mask on the dielectric layer; and
removing the mask, to form a protrusion comprising an insulating layer comprising the insulating material.

24. The method of claim 23, wherein the providing a porous layer comprises:
coating a suspension comprising a ceramic fine particle and a solvent, on the dielectric layer; and
sintering the suspension to form the porous layer.

25. The method of claim 23, wherein the providing a porous layer comprises:
growing a carbon nanotube on the dielectric layer.

26. The method of claim 23, further comprising providing an adhesive material on the mask and the dielectric layer, before the providing an insulating material.

* * * * *